(12) United States Patent
Saigo

(10) Patent No.: US 6,514,800 B2
(45) Date of Patent: Feb. 4, 2003

(54) METHOD OF MANUFACTURING THIN-FILM TRANSISTOR

(75) Inventor: Shingo Saigo, Kagoshima (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/948,634

(22) Filed: Sep. 10, 2001

(65) Prior Publication Data

US 2002/0031872 A1 Mar. 14, 2002

(30) Foreign Application Priority Data

Sep. 8, 2000 (JP) ........................................ 2000-273335

(51) Int. Cl.[7] .............................................. H01L 21/84
(52) U.S. Cl. ........................ 438/149; 438/158; 438/964
(58) Field of Search ................................ 438/149, 158, 438/161, 964, 965

(56) References Cited

U.S. PATENT DOCUMENTS

| 4,686,553 A | * | 8/1987 | Possin ........................ 257/386 |
| 5,485,028 A | * | 1/1996 | Takahashi et al. .......... 257/344 |
| 6,362,031 B1 | * | 3/2002 | Yamaguchi et al. ......... 438/158 |

FOREIGN PATENT DOCUMENTS

| EP | 377084 | * | 7/1990 |
| JP | 6-3699 | | 1/1994 |
| JP | 08-274340 | * | 10/1996 |
| JP | 63-031168 | * | 2/1998 |
| JP | 11-233782 | | 8/1999 |

* cited by examiner

*Primary Examiner*—Trung Dang
(74) *Attorney, Agent, or Firm*—Young & Thompson

(57) ABSTRACT

In a method of manufacturing a thin-film transistor, when channel etching for removing predetermined portions of an ohmic layer and a diffusion layer thereof by plasma etching is to be performed, a surface of a semiconductor layer of a channel portion is formed to have predetermined steps.

6 Claims, 2 Drawing Sheets

HEIGHT H (Å) OF STEPS ON SURFACE OF SEMICONDUCTOR LAYER IN CHANNEL PORTION

METHOD OF MANUFACTURING THIN-FILM TRANSISTOR

BACKGROUND OF THE INVENTION

1. Field of the Invention

The present invention relates to a method of manufacturing a thin-film transistor used in a display panel or the like for a liquid crystal display apparatus and, more particularly, to a method of manufacturing a thin-film transistor capable of stabilizing display characteristics in a display panel or the like.

2. Description of the Prior Art

For example, thin-film transistors are formed on a matrix type liquid crystal panel, and are used to control the ON/OFF operations of pixels that form the liquid crystal panel.

A conventional thin-film transistor has the following problem.

As described above, a thin-film transistor is used to control the ON/OFF operation of each pixel on a matrix type liquid crystal panel. A thin-film transistor with unstable characteristics may adversely affect the quality of a fabricated liquid crystal panel. Thus, to stabilize the characteristics of the thin-film transistor is significant in maintaining the quality of the liquid crystal panel.

SUMMARY OF THE INVENTION

The present invention has been made in view of the above situation of the prior art technique, and has as its object to provide a method of manufacturing a thin-film transistor the characteristics of which can be stabilized.

In order to achieve the above object, according to the main aspect of the present invention, there is provided a method of manufacturing a thin-film transistor wherein, when channel etching for removing predetermined portions of an ohmic layer and a diffusion layer thereof by plasma etching is to be performed, a surface of a semiconductor layer of a channel portion is formed to have predetermined steps.

In the above aspect, the predetermined steps have a height which is adjusted within 200 Å to 500 Å by plasma etching.

In the above aspect, plasma etching is performed by a plasma dry etching device.

In the above aspect, plasma etching is performed by introducing $SF_6/HCl/He=200/200/100$ (SCCM) gas, $CHF_3/O_2=180/180$ (SCCM) gas, or $SF_6/HCl/He=50/50/100$ (SCCM) gas into the plasma dry etching device.

As is apparent from the above aspects, in the thin-film transistor manufacturing method according to the present invention, when channel etching for removing a predetermined ohmic layer and a diffusion layer thereof by plasma etching is to be performed, a surface of a semiconductor layer of a channel portion is formed to have predetermined steps. Thus, the characteristics of the thin-film transistor can be stabilized. In particular, when the thin-film transistor according to the present invention is used in a liquid crystal panel, both a write current to a pixel electrode and an off-leak current can be stabilized, and good display characteristics can be obtained.

The predetermined steps in the thin-film transistor manufacturing method according to the present invention have a height which is adjusted within 200 Å to 500 Å by plasma etching. Thus, the characteristics of the thin-film transistor can be stabilized correctly.

Plasma etching in the thin-film transistor manufacturing method according to the present invention is performed by the plasma dry etching device. Thus, the surface of the semiconductor layer of the channel portion can correctly form the predetermined steps.

In the thin-film transistor manufacturing method according to the present invention, the plasma dry etching device performs plasma etching by introducing $SF_6/HCl/He=200/200/100$ (SCCM) gas, $CHF_3/O_2=180/180$ (SCCM) gas, or $SF_6/HCl/He=50/50/100$ (SCCM) gas into it. Thus, the surface of the semiconductor layer of the channel portion can form the predetermined steps more correctly.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF THE PREFERRED EMBODIMENTS

Several preferred embodiments of the present invention will be described in detail with reference to the accompanying drawings.

Figure 1:
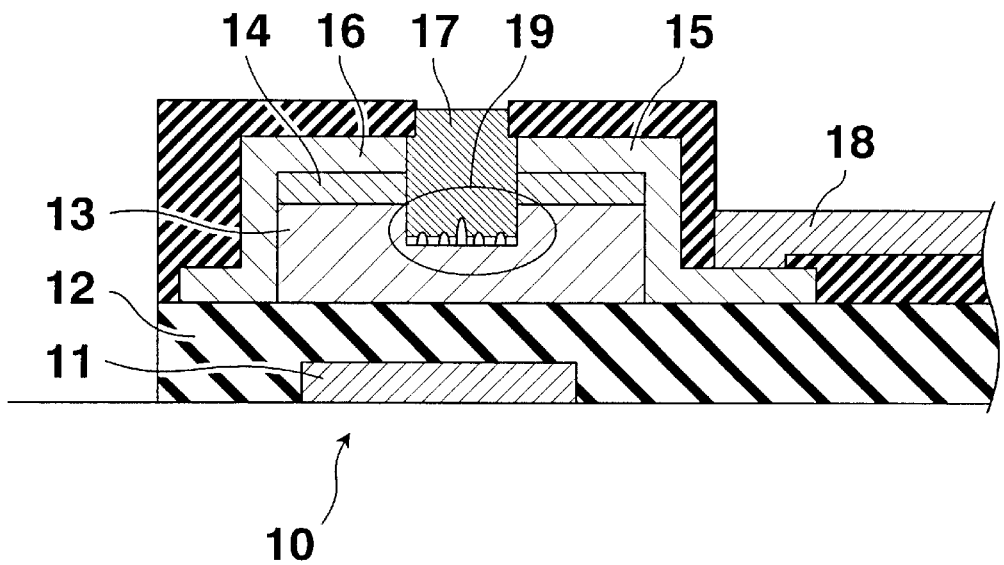
FIG. 1 is a sectional view of an inverted stagger type channel etching thin-film transistor as the first embodiment manufactured by a manufacturing method according to the present invention.

FIG. 1 is a sectional view of an inverted stagger type channel etching thin-film transistor 10 as the first embodiment manufactured by a manufacturing method according to the present invention.

As shown in FIG. 1, the inverted stagger type channel etching thin-film transistor 10 is formed by stacking a gate electrode 11, gate insulating layer 12, semiconductor layer 13, ohmic layer 14, source electrode 15, drain electrode 16, passivation layer 17, and transparent pixel electrode 18.

A large number of pixels are arranged on a matrix type liquid crystal panel (not shown), and the pixel electrode 18 is connected to each pixel. The pixel electrode 18 is connected to the source electrode 15. The inverted stagger type channel etching thin-film transistor 10 can control the ON/OFF operation of the pixel electrode 18 through the gate electrode 11, so that an image is formed on the liquid crystal panel.

The surface of the semiconductor layer of a channel portion 19 of the inverted stagger type channel etching thin-film transistor 10 is closely related to the characteristics of the transistor. Therefore, plasma etching of the channel portion 19 must form the surface of the semiconductor layer of the channel portion 19 to have steps with a height of 200 Å to 500 Å, so that not only predetermined portions of the ohmic layer 14 and its diffusion layer are removed but also both the write current to the pixel electrode 18 and the off-leak current can be stabilized.

For this purpose, in the manufacturing process for the inverted stagger type channel etching thin-film transistor 10, when channel etching is to be performed for removing the predetermined portions of the ohmic layer 14 and its diffusion layer by plasma etching, plasma etching adjusted such that the height of the steps on the surface of the semiconductor layer of the channel portion 19 becomes 200 Å to 500 Å is performed.

If the surface of the semiconductor layer of the channel portion 19 has steps with a height of 100 Å or less, although a good write current is obtained, the off-leak current increases to cause display nonuniformity of the pixels. Also, if the surface of the semiconductor layer of the channel portion 19 has steps with a height of 700 Å or more, the write current decreases, and display nonuniformity occurs.

Figure 2:
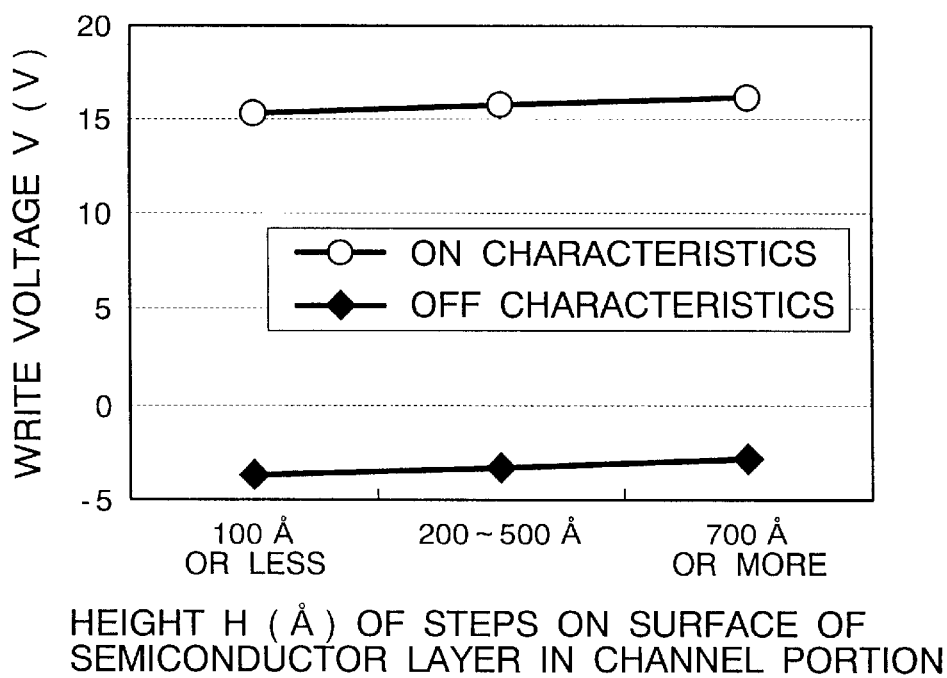
FIG. 2 is a graph showing the display characteristics of the reliability evaluation of an inverted stagger type channel etching thin-film transistor manufactured by the manufacturing method according to the present invention.

In the manufacturing process for the inverted stagger type channel etching thin-film transistor 10, plasma etching is performed by a plasma dry etching device. When performing plasma etching, one of the following gases is introduced to the plasma dry etching device:

① $SF_6/HCl/He=200/200/100$ (SCCM) gas
② $CHF_3/O_2=180/180$ (SCCM) gas
③ $SF_6/HCl/He=50/50/100$ (SCCM) gas FIG. 2 shows the display characteristics concerning the reliability evaluation of the inverted stagger type channel etching thin-film transistor 10 according to the present invention, in which the axis of ordinate represents a write voltage V and the axis of abscissa represents a height H of the steps on the surface of the semiconductor layer of the channel portion 19. Although the display characteristics are also related to the leak voltage of the channel portion, only the write voltage V will be employed as a factor concerned.

In the liquid crystal panel of a liquid crystal display apparatus, generally, the ON characteristics of the write voltage V range from 10 V to 20 V. It is known that the closer to 10 V, the better the display characteristics, and the closer to 20 V, the more unstable (occurrence of display nonuniformity) the display characteristics. The OFF characteristics of the write voltage V range from 0 to −5 V. It is known that the closer to 0 V, the better the display characteristics, and the closer to −5 V, the more unstable (occurrence of display nonuniformity) the display characteristics.

The graph shown in FIG. 2 will be analyzed. If the steps on the surface of the semiconductor layer of the channel portion 19 have a height of 100 Å or less, although the ON characteristics of the write voltage V are good, the OFF characteristics degrade. If the steps on the surface of the semiconductor layer of the channel portion 19 have a height of 700 Å or more, although the OFF characteristics are good, the ON characteristics degrade.

As is apparent from FIG. 2, if the steps on the surface of the semiconductor layer of the channel portion 19 are formed to have a height of 200 Å to 500 Å, both the ON characteristics and OFF characteristics of the write voltage V take satisfactory values.

Figure 3:
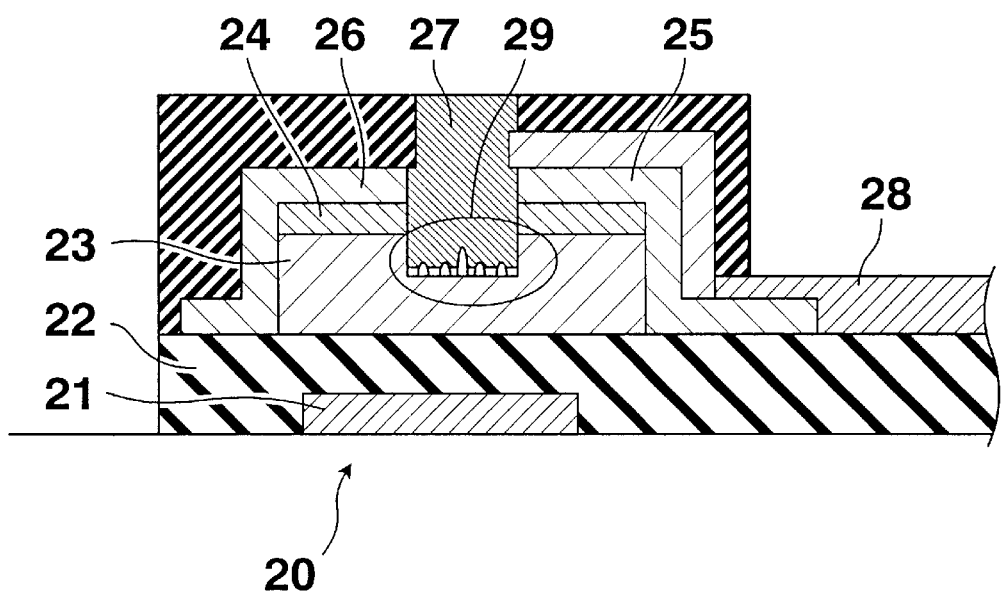
FIG. 3 is a sectional view of an inverted stagger type channel etching thin-film transistor as the second embodiment manufactured by the manufacturing method according to the present invention.

FIG. 3 shows a sectional view of an inverted stagger type channel etching thin-film transistor 20 as the second embodiment manufactured by the manufacturing method according to the present invention.

The respective constituent portions of the inverted stagger channel etching thin-film transistor 20 are identical to those of the first embodiment shown in FIG. 1, and only their shapes are different. Hence, a description on these constituent portions will be omitted.

In the above embodiments, the inverted stagger type channel etching thin-film transistors 10 and 20 are described. The same operation as that described above can be performed with other thin-film transistors as well.

What is claimed is:

1. A method of manufacturing a thin-film transistor wherein, when channel etching for removing predetermined portions of an ohmic layer and a diffusion layer thereof by plasma etching is to be performed, a surface of a semiconductor layer of a channel portion is formed to have predetermined steps.

2. A method according to claim 1, wherein the predetermined steps have a height which is adjusted within 200 Å to 500 Å by plasma etching.

3. A method according to claim 1, wherein plasma etching is performed by a plasma dry etching device.

4. A method according to claim 3, wherein plasma etching is performed by introducing $SF_6/HCl/He=200/200/100$ (SCCM) gas into the plasma dry etching device.

5. A method according to claim 3, wherein plasma etching is performed by introducing $CHF_3/O_2=180/180$ (SCCM) gas into the plasma dry etching device.

6. A method according to claim 3, wherein plasma etching is performed by introducing $SF_6/HCl/He=50/50/100$ (SCCM) gas into the plasma dry etching device.

* * * * *